United States Patent
Shiraishi et al.

(12) 
(10) Patent No.: US 6,665,148 B2
(45) Date of Patent: Dec. 16, 2003

(54) MAGNETIC HEAD APPARATUS WITH IC CHIP MOUNTED ON SUSPENSION FOR INCREASED HEAT DIFFUSION AND MAGNETIC DISK APPARATUS HAVING MAGNETIC HEAD APPARATUS

(75) Inventors: Masashi Shiraishi, Chuo-ku (JP); Takeshi Wada, Chuo-ku (JP); Mitsuyoshi Kawai, Chuo-ku (JP); Takashi Honda, Chuo-ku (JP); Norikazu Ota, Chuo-ku (JP); Takao Matsumoto, Chuo-ku (JP); Atsushi Hirose, Chuo-ku (JP)

(73) Assignee: TDK Corporation, Tokyo (JP)

( * ) Notice: Subject to any disclaimer, the term of this patent is extended or adjusted under 35 U.S.C. 154(b) by 180 days.

(21) Appl. No.: 09/924,965

(22) Filed: Aug. 9, 2001

(65) Prior Publication Data

US 2002/0021531 A1 Feb. 21, 2002

(30) Foreign Application Priority Data

Aug. 9, 2000 (JP) .................................... P. 2000 241305

(51) Int. Cl.⁷ .................................................. G11B 5/55
(52) U.S. Cl. .................................................... 360/244.1
(58) Field of Search ...................................... 360/244.1

(56) References Cited

U.S. PATENT DOCUMENTS 6,134,084 A * 10/2000 Ohwe ....................... 360/244.1
6,144,530 A * 11/2000 Shiraishi ................... 360/244.1
6,252,743 B1 * 6/2001 Bozorgi .................... 360/244.1

FOREIGN PATENT DOCUMENTS

JP  56-9576    1/1981
JP  62-197909  9/1987
JP  3-187295   8/1991

* cited by examiner

Primary Examiner—A. J. Heinz
(74) Attorney, Agent, or Firm—Oblon, Spivak, McClelland, Maier & Neustadt, P.C.

(57) ABSTRACT

A magnetic head apparatus including a magnetic head slider having at least one thin film magnetic head element, a suspension mounting the magnetic head slider on one face thereof, an IC chip mounted with a circuit for the thin film magnetic head element and a support arm fixedly supporting the suspension in which the IC chip is mounted on the one face of the suspension and is thermally coupled to the support arm.

9 Claims, 14 Drawing Sheets

MAGNETIC HEAD APPARATUS WITH IC CHIP MOUNTED ON SUSPENSION FOR INCREASED HEAT DIFFUSION AND MAGNETIC DISK APPARATUS HAVING MAGNETIC HEAD APPARATUS

BACKGROUND OF THE INVENTION

The present invention relates to a magnetic head apparatus with an IC chip to drive a thin film magnetic element used in, for example, a magnetic disk apparatus or the like and a magnetic disk apparatus having the magnetic head apparatus.

According to a magnetic disk apparatus, a magnetic head slider attached to a front end section of a suspension is made to fly from a surface of a rotating magnetic disk and under the state, recording to the magnetic disk and/or reproducing from the magnetic disk are carried out by a thin film magnetic head element mounted to the magnetic head slider.

With large capacity and high density recording of a magnetic disk apparatus in recent years, high data rate has been progressed and a constitution proposed as one of means for achieving the high data rate, is a structure in which a section of a drive circuit for the magnetic head element is formed with an IC chip and the IC chip is mounted on a suspension (chip on suspension structure). By adopting the structure, a wiring distance from the drive circuit to the magnetic head element is shortened and accordingly, unnecessary noise added to a head drive signal can be reduced, as a result, a recording characteristic in a high data rate is promoted. Further, a very weak signal outputted from a reading head element of a magnetoresistive effect (MR) type, can be amplified at a location more proximate to the MR type head element.

According to such IC chip, in view of its mounted structure, dimensions need to be very small, however, when the dimensions are reduced, a surface area of the IC chip is reduced by an amount of the reduced dimensions and heat radiation becomes insufficient. Further, since the IC chip must be mounted on a suspension having a small space and since at a high data rate up to 1 Gbps, parasitic impedance of a lead frame constituting a terminal when packaged, generates noise which effects adverse influence on electric performance, the IC chip assembly needs to be formed in a bare chip assembly. Therefore, heat radiation of the IC chip is further decreased. Moreover, considerably large current flows in the IC chip in recording operation and accordingly, the heat generation is much increased and therefore, insufficient heat radiation performance causes a serious problem.

Further, as a spring member of the suspension, there is normally used a leaf spring made of stainless steel, however, stainless steel is provided with low heat conductivity as a metal material and therefore, when the chip on suspension structure is adopted, cooling by heat radiation can not be so much expected.

In this way, according to a conventional magnetic head apparatus having the chip on suspension structure, there pose the following problems:

(1) Since the IC chip is very thin and small, an effective measure of heat radiation against the heat generation is difficult.

(2) Since the IC chip is mounted on the suspension on a side opposed to a magnet, it is difficult to attach a heat radiation structure directly to the IC chip per se.

(3) Since stainless steel used for the spring member of the suspension is provided with the low heat conductivity, the heat radiation cannot be carried out sufficiently by the normal chip on suspension structure.

A technology of mounting the IC chip not on the suspension but directly on a support arm (swing arm) for supporting the suspension is publicly known (for example, Japanese Utility Model Publication No. Sho. 56-9576, Japanese Patent Publication No. Sho. 62-197909, Japanese Patent Publication No. Hei. 3-187295). However, according to the structure for mounting the IC chip directly on the support arm, the respective support arm needs to be separately mounted with the suspension and the IC chip respectively and accordingly, there poses a problem that not only a number of integrating steps is increased and integrating steps are troublesome but also an integration time period is prolonged. Further, since the size of IC chip is further reduced and since the support arm is provided with a three-dimensional structure, it is significantly difficult to mount the IC chip directly on the respective support arm.

Further, caution is required in that the well-known technologies of mounting the IC chip on the support arm are technologies of mounting the packaged IC chip. According to the package IC chip, heat can be radiated from a lead frame and therefore, heat generation does not pose a serious problem. When the IC is mounted to a portion having a small space and when the IC chip is formed by a bare chip in order to deal with high data rate as in the IC chip according to the invention, the problem of heat generation is particularly posed.

SUMMARY OF THE INVENTION

The invention is for resolving the above-described problems of the conventional technologies and it is an object thereof to provide a magnetic head apparatus having a novel structure in which integration thereof is simple and heat radiation of an IC chip can further be expedited even when the IC chip is formed by a bare chip and a magnetic disk apparatus having the magnetic head apparatus.

According to the invention, there is provided a magnetic head apparatus characterized in comprising a magnetic head slider having at least one thin film magnetic head element, a suspension mounting the magnetic head slider on one face thereof, an IC chip mounted with a circuit for the thin film magnetic head element and a support arm for fixedly supporting the suspension, wherein the IC chip is mounted on the one face of the suspension and is thermally coupled to the support arm.

There is constructed a constitution in which the IC chip mounted with the circuit for the thin film magnetic head element is not directly mounted on the support arm but is mounted on the suspension and is thermally coupled with the support arm. By constituting in this way, a head gimbal assembly (HGA) may be formed by previously mounting the IC chip on the suspension, that is, by previously integrating the magnetic head slider and the IC chip on the suspension having traces and the HGA maybe attached to the support arm and therefore, the integration becomes very simple, a reduction in a number of integrating steps and shortening of integration time period are achieved, further, heat radiation is significantly expedited by conducting heat to the support arm and utilizing the support arm as a heat sink.

It is preferable that the IC chip is mounted to a vicinity of a section of the suspension fixedly attached to the support arm and the support arm is brought into contact with other face of the suspension at a section of the suspension mounted with the IC chip.

It is also preferable that the IC chip is mounted to a vicinity of a section of the suspension fixedly attached to the support arm and the support arm and the IC chip are thermally coupled directly via a member having a high heat conductivity. In this case, it is more preferable that the member having the high heat conductivity is brought into contact with a face of the suspension on a side opposed to a face of the suspension for mounting the IC chip.

It is also preferable that the suspension comprises a metal material including a material having a high heat conductivity, or the suspension is provided with a structure of laminating a material layer having a high heat conductivity on a metal member.

It is also preferable that the IC chip is mounted to the vicinity of the section of the suspension fixedly attached to the support arm and the support arm and the IC chip are thermally coupled via a through port provided at a spring member of the suspension. In this case, it is more preferable that the support arm and the IC chip are thermally coupled via only a resin layer of the suspension.

DETAILED DESCRIPTION OF THE PREFERRED EMBODIMENTS

Embodiment 1

Figure 1:
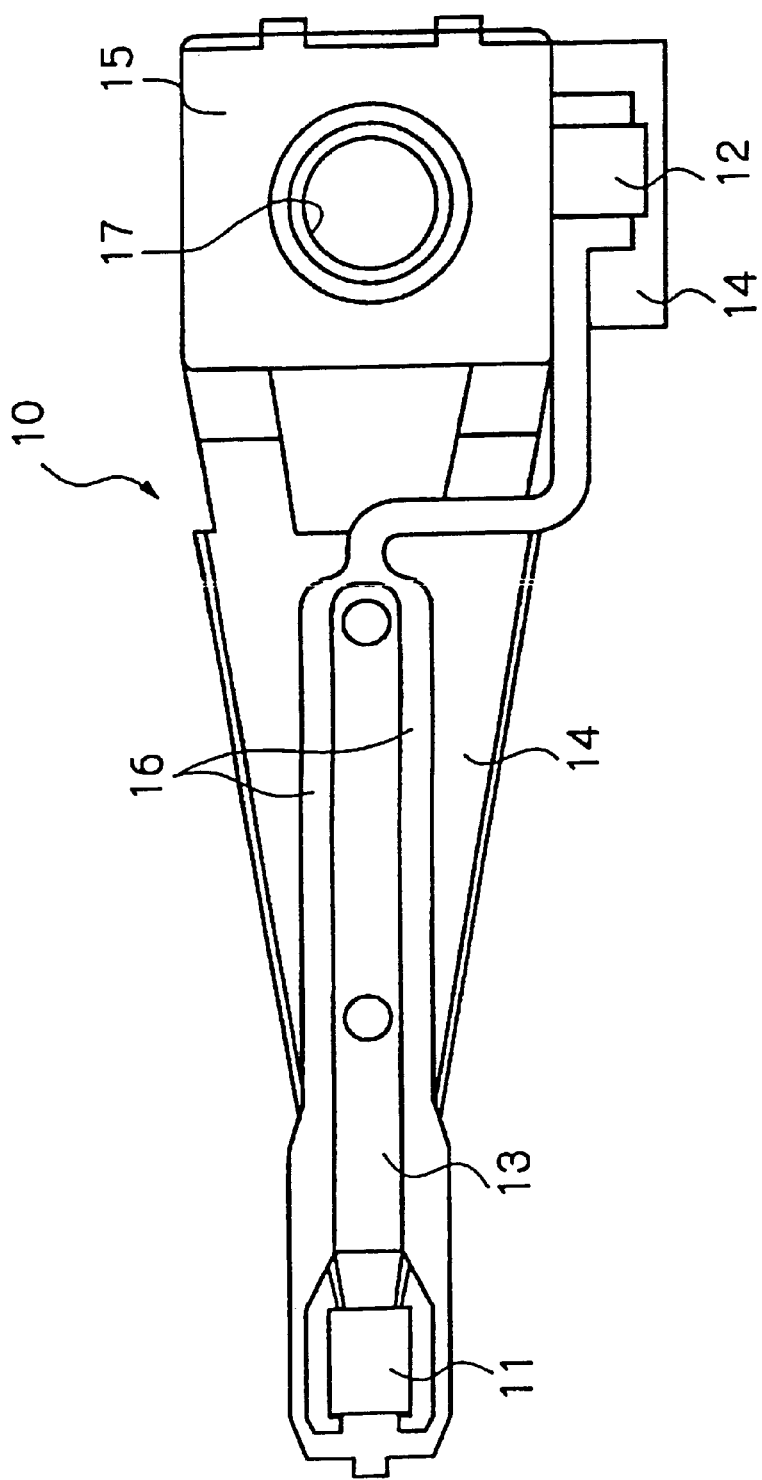
FIG. 1 is a bottom view illustrating a side of a face of HGA opposed to a magnetic disk according to a first embodiment of the invention.
Figure 2:
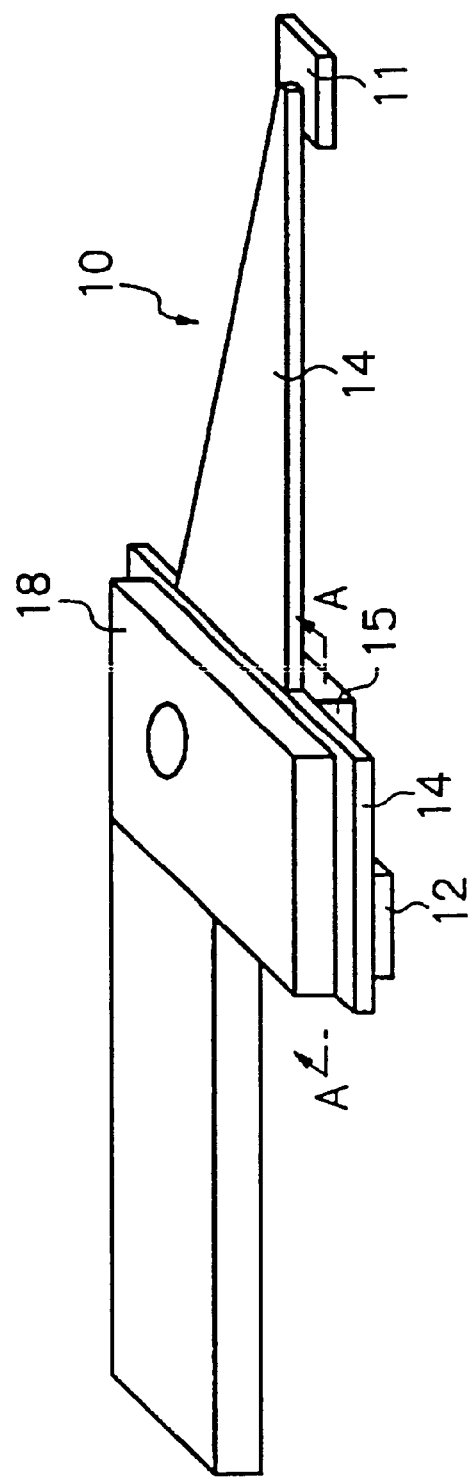
FIG. 2 is a perspective view showing portions of HGA and a support arm according to the embodiment of FIG. 1.
Figure 3:
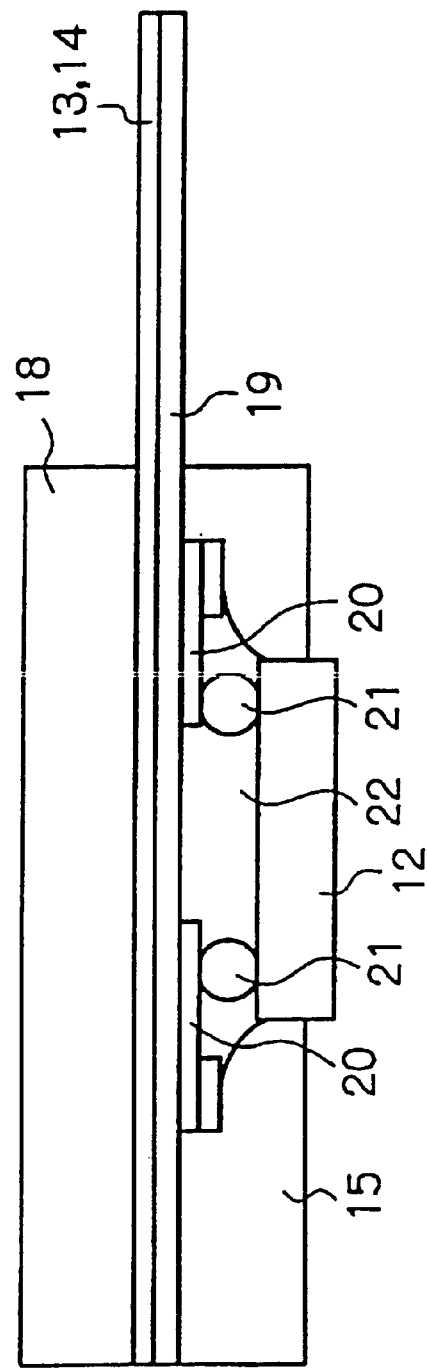
FIG. 3 is a sectional view taken along a line A—A of FIG. 2.

FIG. 1 is a bottom view illustrating a side of a face of ahead gimbal assembly (HGA) opposed to a magnetic disk according to a first embodiment of a magnetic head apparatus according to the invention, FIG. 2 is a perspective view showing HGA and a section of a support arm according to the embodiment and FIG. 3 is a sectional view taken along a line A—A of FIG. 2.

As shown by FIG. 1 and FIG. 2, HGA comprises fixedly attaching a magnetic head slider 11 having at least one thin film magnetic head element to a front end section of a suspension 10 and mounting an IC chip 12 for driving head and amplifying a read signal to a side of a section of attaching the suspension 10. The slider 11 and the IC chip 12 are attached on faces of the suspension 10 on a side opposed to a magnetic disk to be opposed to a surface of the magnetic disk.

As shown by FIG. 1, the suspension 10 mainly includes a flexure 13 having elasticity for carrying the slider 11 at a tongue section provided at one end section thereof and supporting the IC chip 12 by other end section thereof, a load beam 14 also having elasticity for supporting and fixedly attaching the flexure 13 and a base plate 15 provided at a base section of the load beam 14.

The load beam 14 is provided with the elasticity for pressing the slider 11 in a direction of a magnetic disk. Meanwhile, the flexure 13 is provided with a soft tongue section centering on a dimple provided between the flexure 13 and the load beam 14 and is provided with the elasticity for flexibly supporting the slider 11 by the tongue section. According to the suspension of a three-piece structure in which the flexure 13 and the load beam 14 are parts independent from each other as in the embodiment, rigidity of the flexure 13 becomes lower than rigidity of the load beam 14.

Inside the IC chip 12, a drive circuit constituting a head amplifier and a read signal amplifying circuit are formed by an IC. The size of the IC chip 12 is 1.4 mm×1.0 mm×0.13 mm simply as an example. In this way, the IC chip 12 is provided with a very small-sized and thin shape.

According to the embodiment, the flexure 13 includes a stainless steel sheet (for example, SUS304TA) having a thickness of about 25 $\mu$m and is formed in a shape having a uniform width smaller than a width of the load beam 14.

A thin film pattern is further formed on the flexure 13 by a well-known patterning method similar to that in forming a printed circuit board on a metal thin plate as in a flexible printed circuit board (FPC). The thin film pattern constitutes a plurality of traces 16 as input and output signal lines, ends of the traces 16 on one side are connected to terminal electrodes of the magnetic head slider 11 provided at a front end of the flexure 13 and ends thereof on other side are connected to a bonding pads of the IC chip 12.

The load beam 14 is constituted by a stainless steel sheet having the elasticity and having a thickness of about 60 through 65 $\mu$m in a shape in which a width thereof is narrowed toward the front end for supporting the flexure 13 over its entire length. However, fixed attachment of the flexure 13 and the load beam 14 is carried out by pin point fixed attachment by a plurality of weld points.

The base plate 15 is constituted by stainless steel thicker than the load beam 14 and is fixedly attached to the base section of the load beam 14 by welding. HGA is attached to a support arm 18 by fixedly attaching the hole 17 for attaching the base plate 15 to the support arm 18 by mechanically calking so called swage.

The support arm 18 is referred to also as a swing arm or a movable arm or the like and is constituted to be driven to pivot centering on a pivoting shaft by an actuator of, for example, a voice coil motor (VCM) or the like, not illustrated, to thereby location a magnetic head relative to a magnetic disk. The support arm 18 is constituted by a material having high heat conductivity, for example, Al or Cu (Al is most preferable as a material of constituting the support arm 18 since Al is provided with high heat conductivity and light-weighted).

Further, the flexure 13 and the load beam 14 may not be provided separately but there may be constructed a suspension having a two-piece structure of a base plate and a flexure load beam.

As mentioned above, at the front end section of the suspension 10, the slider 11 having the magnetic head element is mounted on the tongue section of the flexure 13. As shown in FIG. 1, the lead conductors 16 constituting a necessary number of input and output signal lines, pass on both sides of the slider 11 and are extended to the front end of the flexure 13, folded back from the front end and connected to input and output electrodes provided at the slider 11. On one side of the base plate 15 of the suspension 10, there is mounted the IC chip on the same face that is attached with the slider 11 (on a face of a side opposed to the magnetic disk).

As shown in FIG. 3, the IC chip 12 is a bare chip and is mounted to bonding pads 20 provided at the conductor pattern formed on the flexure 13 on the load beam 14 at the side of the base plate 15 via an insulating material layer 19 of polyimide or the like with, for example, gold balls 21. At a clearance between a bottom face of the IC chip 12 and the thin film pattern, there is filled an underfill 22 for promoting heat radiation characteristic, promoting mechanical strength and covering the IC chip 12 active region surface.

As is apparent from FIG. 2 and FIG. 3, the support arm 18 constituted by the material having high conductivity is bonded to a face on an opposed side of the suspension 10 (more specifically, the load beam 14) at a location mounted with the IC chip 12, thereby, the IC chip 12 and the support arm 18 are thermally bonded. That is, there is constructed a constitution in which heat of the IC chip 12 is positively conducted to the support arm 18 having the high heat conductivity in contact with the rear side of the suspension 10 and the heat is radiated effectively by utilizing the support arm 18 as a heat sink.

As described above, although the IC chip 12 is constituted to be very small-sized and thin, since write current of several tens miliamperes is made to flow therein, enormous heat is generated. There poses a problem that the heat not only effects an influence on the IC chip 12 per se but also effects an influence on the MR type head element and stainless steel constituting the flexure 13 and the load beam 14 constituting spring members of the suspension 10 is locally heated. Although the IC chip 12 can be cooled more or less by an air cooling effect by rotating the magnetic disk, since the clearance between the IC chip 12 and the surface of the magnetic disk is very small, it is difficult to provide a measure for further promoting the air cooling effect to the side of the IC chip of the suspension also in view of completely restraining the IC chip 12 from being brought into contact with the surface of the magnetic disk.

Figure 4:
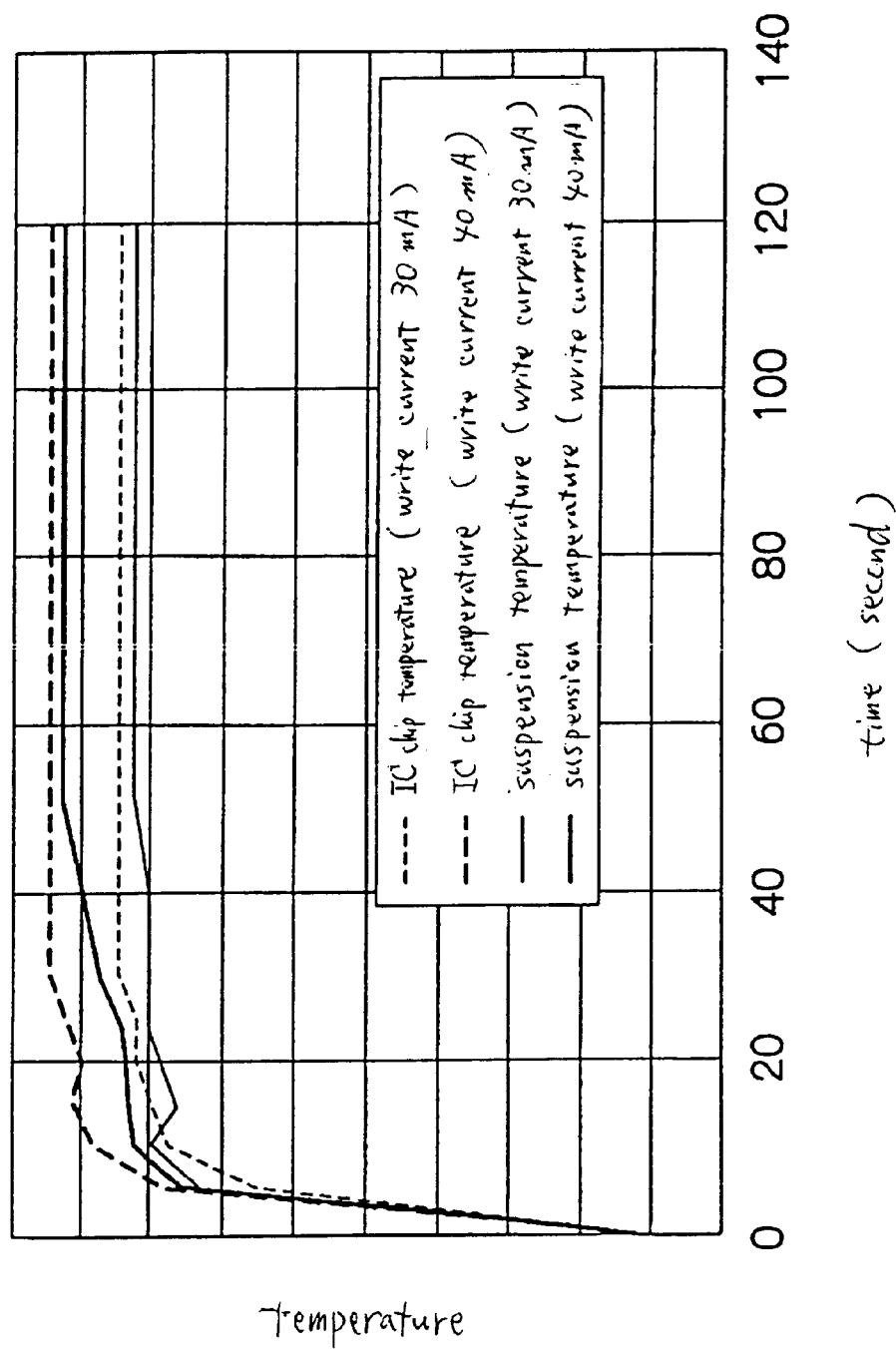
FIG. 4 is a characteristic diagram of temperature of an IC chip and temperature of a rear face of a suspension with regard to time when a magnetic disk is not rotated.
Figure 5:
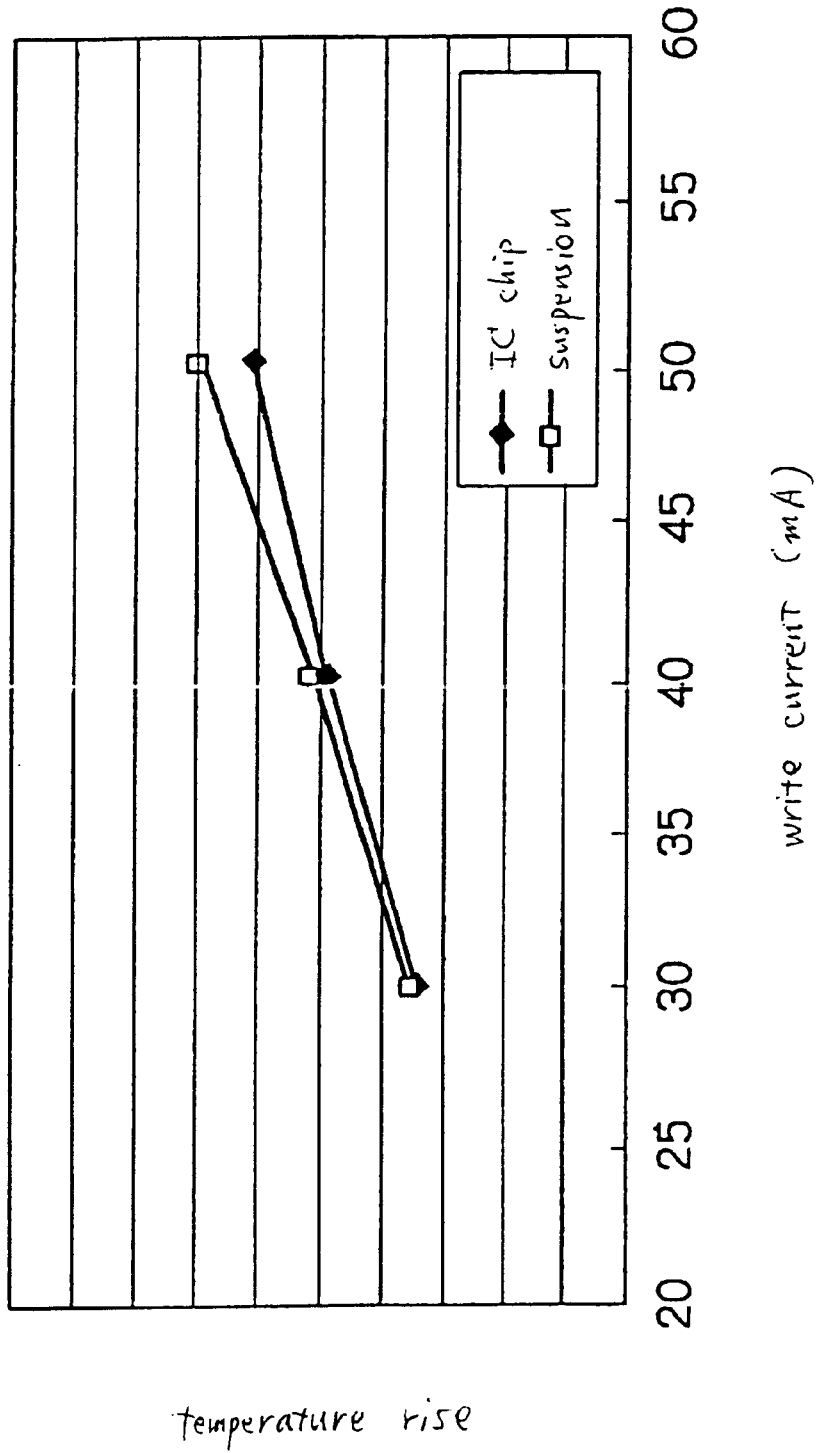
FIG. 5 is a characteristic diagram of temperature rise of an IC chip and temperature rise of a rear face of a suspension with regard to write current when a magnetic disk is rotated.

Generally, there are relationships as shown by FIG. 4 and FIG. 5 between temperature of heat generation of the IC chip and temperature of the face on the rear surface of the suspension at the position of mounting the IC chip. Incidentally, FIG. 4 shows a characteristic of the temperature of the IC chip and the temperature of the rear face of the suspension with regard to time when the magnetic disk is not rotated and FIG. 5 shows a characteristic of temperature rise of the IC chip and temperature rise of the rear face of the suspension with regard to write current when the magnetic disk is rotated.

It is known from these drawings that the temperature of the rear face of the suspension at the position of mounting the IC chip is elevated to a value substantially the same as the temperature of the IC chip per se. The heat of the IC chip is conducted to the suspension via terminal sections constituted by gold or solder and in the suspension having the low heat conductivity, heat is hardly conducted or distributed. Therefore, heat is not radiated in the suspension per se.

Hence, according to the embodiment, the heat is radiated by efficiently conducting the heat generated by the IC chip 12 to the support arm 18 formed in a shape which is brought into contact with the face on the opposed side of the suspension at the location of mounting the IC chip 12.

Therefore, according to the embodiment, the heat of the IC chip can be diverged without hampering the space between the IC chip and the magnetic disk and temperature of the IC chip can be lowered. In this way, a sufficient cooling effect of the IC chip is provided and therefore, the influence on the MR type head element by the heat can be prevented. Further, the IC chip can be prevented from locally heating the suspension and protection of the suspension can be achieved.

Further, according to the embodiment, there is constructed a constitution in which HGA is integrated by previously mounting the IC chip 12 on the suspension 10 and HGA is attached to the support arm 18 and accordingly, integration of a head stack assembly (HSA) constituted by mounting a plurality of HGAs to respective support arms becomes very simple, a reduction in integrating steps and shortening of the integration time period can be achieved and as described above, the heat can effectively be radiated via the support arms.

Embodiment 2

Figure 6:
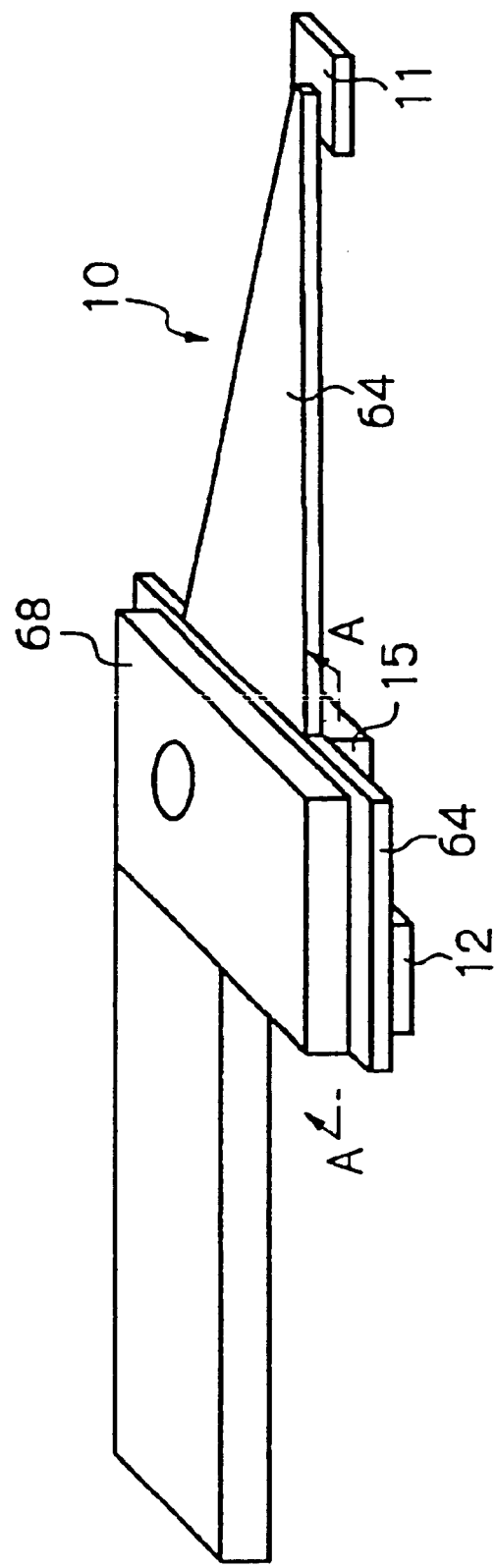
FIG. 6 is a perspective view showing portions of HGA and a support arm according to a second embodiment of the invention.
Figure 7:
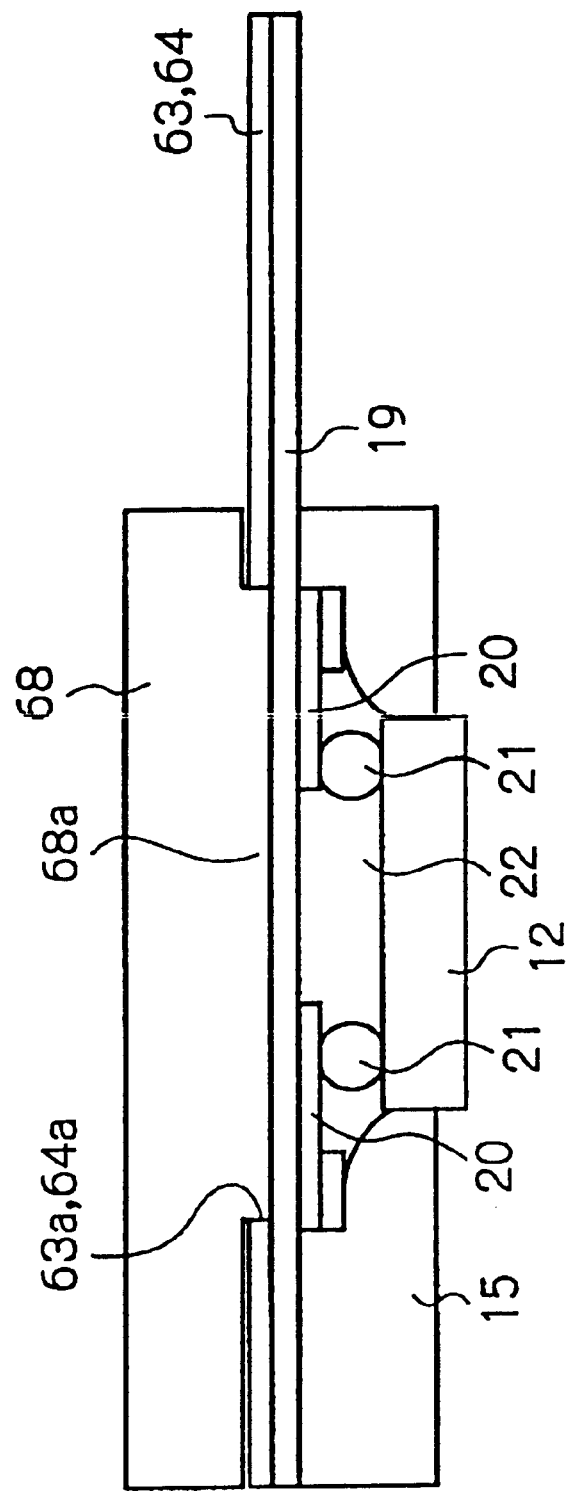
FIG. 7 is a sectional view taken along a line A—A of FIG. 6.

FIG. 6 is a perspective view showing sections of HGA and a support arm according to a second embodiment of a magnetic head apparatus of the invention and FIG. 7 is a sectional view taken along a line A—A of FIG. 6.

As is apparent from the drawings, according to the embodiment, at the position of mounting the IC chip 12, through ports 63a and 64a are respectively formed at a flexure 63 and a load beam 64 constituting spring members of the suspension 10, a section 68a of a support arm 68 is directly coupled to the insulating material layer 19 of polyimide or the like at the sections of the bonding pads 20 mounted with the IC chip 12, thereby, the IC chip 12 and the support arm 68 are thermally coupled. That is, by removing the spring members made of stainless steel having low heat conductivity at the location of mounting the IC chip 12, heat of the IC chip 12 is positively conducted by the support arm 68 having high heat conductivity and heat is effectively radiated by utilizing the support arm 68 as a heat sink.

Other constitution, used material and operation and effect according to the embodiment are quite similar to those in the case of the first embodiment of FIG. 1 through FIG. 3. Therefore, in FIG. 6 and FIG. 7, the same reference numerals are used for constituent elements the same as those in FIG. 2 and FIG. 3.

Embodiment 3

Figure 8:
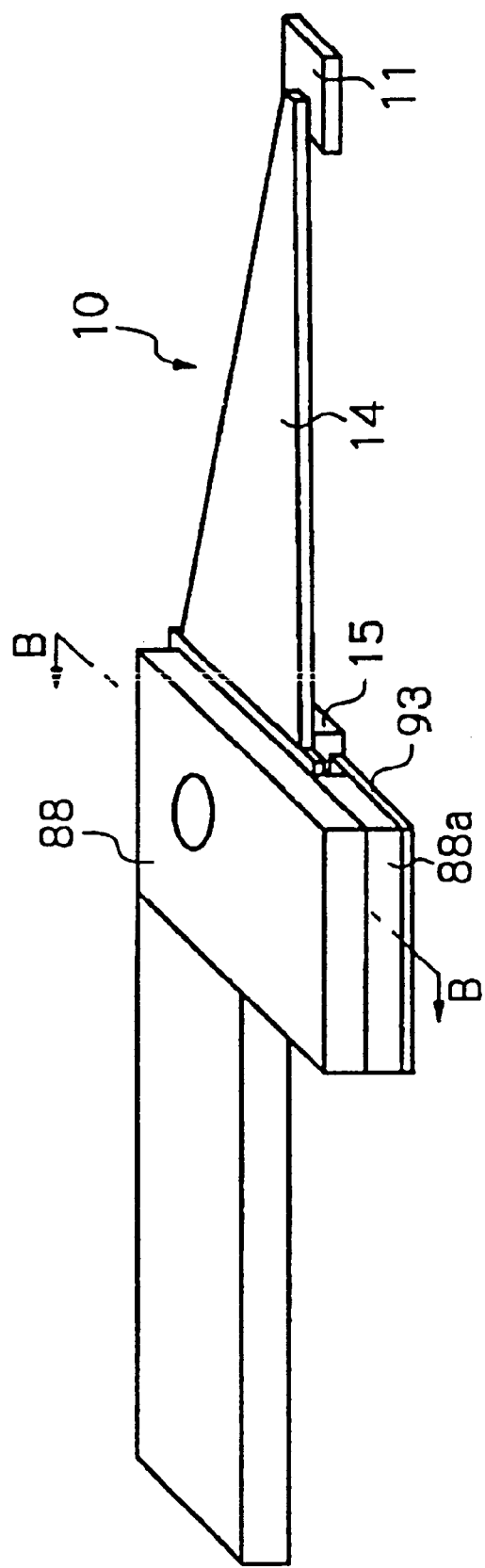
FIG. 8 is a perspective view showing sections of HGA and a support arm according to a third embodiment of the invention.
Figure 9:
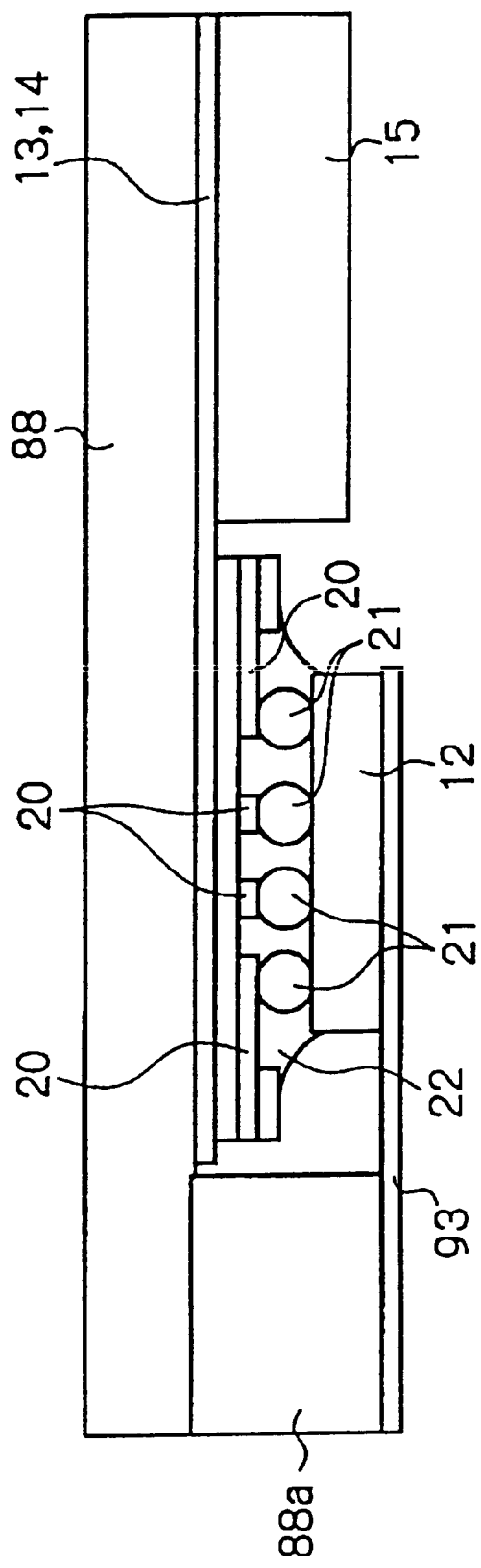
FIG. 9 is a sectional view taken along a line B—B of FIG. 8.

FIG. 8 is a perspective view showing sections of HGA and a support arm according to a third embodiment of a magnetic head apparatus according to the invention and FIG. 9 is a sectional view taken along a line B—B of FIG. 8.

As is apparent from the drawings, according to the embodiment, the IC chip 12 and a support arm 88 are thermally coupled directly via a member 93 having high heat conductivity. That is, the plate member 93 made of, for example, Al or Cu having high heat conductivity bonded to a section 88a of the support arm 88, is bonded to a face 12a of the IC chip 12 on a side opposed to a face of mounting the IC chip 12, thereby, the IC chip 12 and the support arm 88 are thermally coupled directly. Although the constitution becomes simpler by thermally coupling the IC chip 12 to the support arm via the base plate 15, the base plate 15 is made of stainless steel, the conductivity is not so high and therefore, as in the embodiment, the member 93 is provided and the IC chip 12 and the support arm 88 are thermally coupled directly and the heat conductivity is further increased.

As the member 93, other than Al or Cu, a metal material or a resin material having high heat conductivity may be used. Further, various variational modes are applicable to the shape of the member 93 and to what portion of the IC chip 12 and the member 93 are brought into contact with each other.

Other constitution, used material and operation and effect of the embodiment are quite similar to those in the case of the first embodiment of FIG. 1 through FIG. 3. Therefore, in FIG. 8 and FIG. 9, the same reference numerals are used for the same constituent elements of FIG. 2 and FIG. 3.

Embodiment 4

Figure 10:
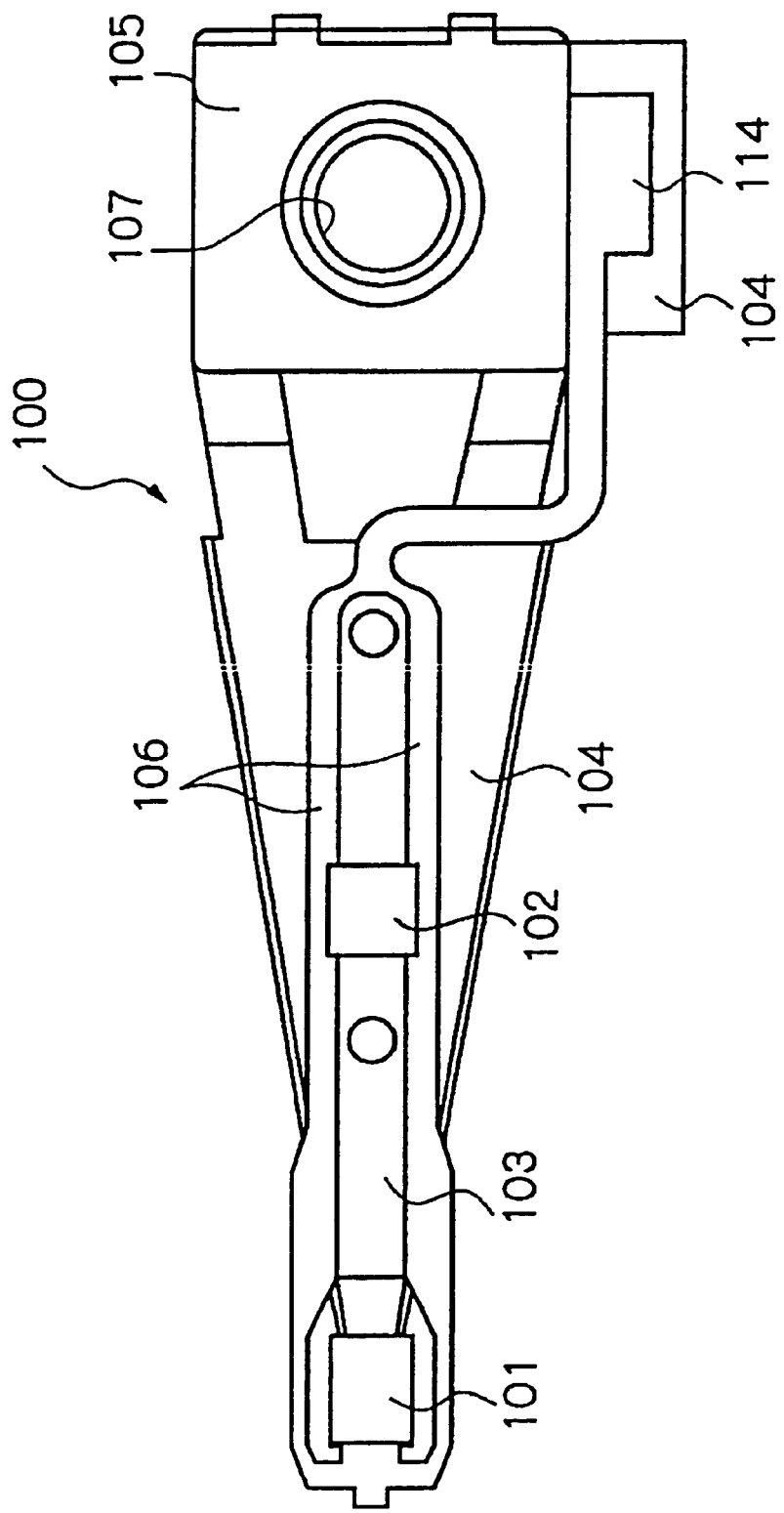
FIG. 10 is a bottom view illustrating a side of a face of HGA opposed to a magnetic disk according to a fourth embodiment of the invention.
Figure 11:
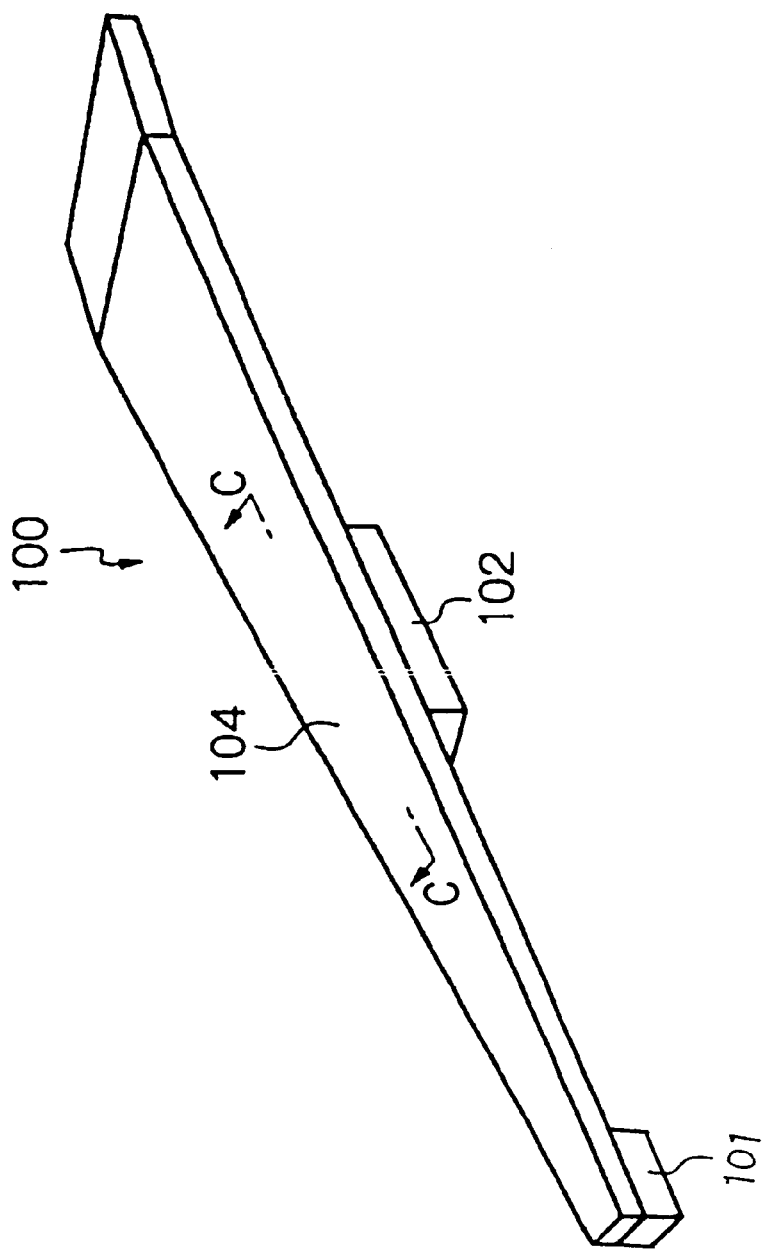
FIG. 11 is a perspective view showing a section of HGA according to the embodiment of FIG. 10.
Figure 12:
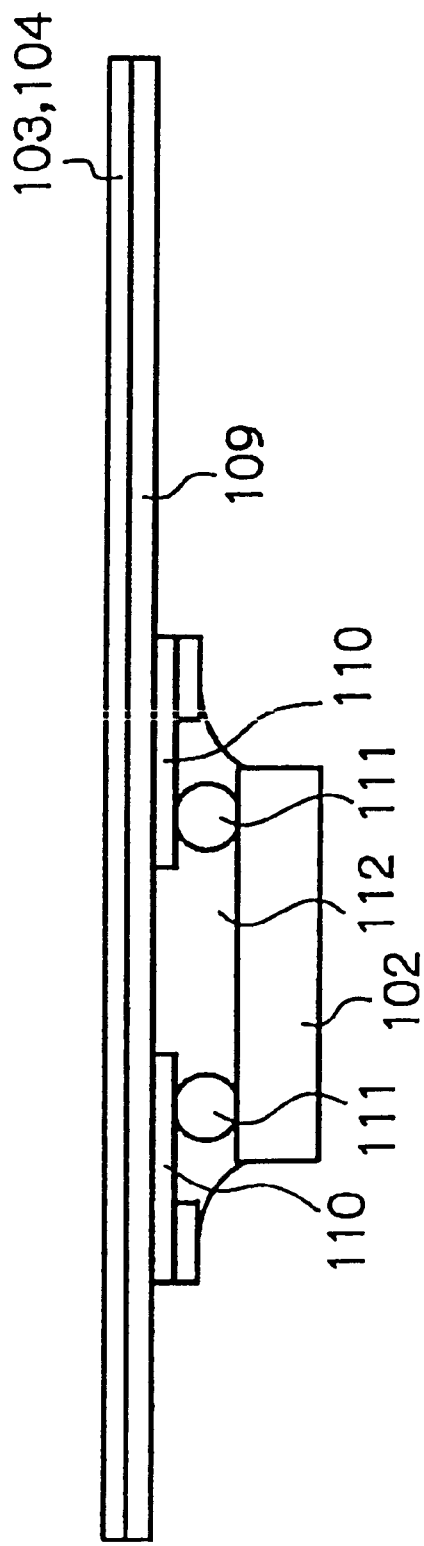
FIG. 12 is a sectional view taken along a line C—C of FIG. 11.

FIG. 10 is a bottom view illustrating a side of a face of HGA opposed to a magnetic disk according to a fourth embodiment of a magnetic head apparatus of the invention, FIG. 11 is a perspective view showing a section of HGA according to the embodiment and FIG. 12 is a sectional view taken along a line C—C of FIG. 11.

As shown in FIG. 10 and FIG. 11, HGA is constituted by fixedly attaching a magnetic head slider 101 having at least one thin film magnetic head element to a front end section of a suspension 100 and mounting an IC chip 102 for driving head and amplifying a read signal to a side of a section thereof for attaching the suspension 100. The slider 101 and the IC chip 102 are attached on faces of the suspension 100 on a side thereof opposed to a magnetic disk to be opposed to a surface of the magnetic disk.

As shown in FIG. 10, the suspension 100 is mainly constituted by a flexure 103 having elasticity for carrying the slider 101 by a tongue section provided at one end section thereof and supporting the IC chip 102 at a middle thereof, a load beam 104 also having elasticity for supporting and fixedly attaching the flexure 103 and a base plate 105 provided at a base section of the load beam 104.

The load beam 104 is provided with the elasticity for pressing the slider 101 in a direction of a magnetic disk. Meanwhile, the flexure 103 is provided with a soft tongue section centering on a dimple provided between the flexure 103 and the load beam 104 and is provided with the elasticity for flexibly supporting the slider 101 by the tongue section. According to the suspension of a three-piece structure in which the flexure 103 and the load beam 104 are parts independent from each other as in the embodiment, rigidity of the flexure 103 is lower than rigidity of the load beam 104.

At inside of the IC chip 102, there are mounted a drive circuit constituting a head amplifier and a signal amplifying circuit which are formed by an IC. The size of the IC chip 102 is 1.4 mm×1.0 mm×0.13 mm simple as an example. In this way, the IC chip 102 is provided with a very small-sized and thin shape.

According to the embodiment, the flexure 103 is constituted by a stainless steel sheet (for example, SUS304TA) having a thickness of about 25 μm and is formed in a shape having a uniform width smaller than a width of the load beam 104.

A thin film pattern is further formed on the flexure 103 by a well-known patterning method the same as that in forming a printed circuit board on a metal thin plate as in a flexible print circuited board (FPC). According to the thin film pattern, there are constituted a plurality of traces 106 as input and output signal lines, ends of the traces 106 on one side are connected to terminal electrodes of the magnetic head slider 101 provided at a front end of the flexure 103 and ends thereof on other side are connected to an external connection pad 114 for connecting to an external circuit via the IC chip 102.

The load beam 104 is constituted by a stainless steel sheet having elasticity and having a thickness of about 60 through 65 μm in a shape in which a width thereof is narrowed toward a front end thereof for supporting the flexure 103 over its entire length. Incidentally, fixed attachment of the flexure 103 and the load beam 104 is carried out by fixed attachment by pin point bonding by a plurality of weld points.

The base plate 105 is constituted by stainless steel thicker than the load beam 104 and is fixedly attached to a base section of the load beam 104 by welding. HGA is attached to a support arm by fixedly attaching an attaching hole 107 of the base plate 105 to the support arm, not illustrated, by mechanical calking so called swage.

The support arm is referred to also as a swing arm, a moveable arm or the like and is constituted to be driven to pivot centering on a pivoting shaft by an actuator of, for example, a voice coil motor (VCM) or the like, not illustrated, to thereby position a magnetic head relative to a magnetic disk. The support arm is constituted by a material having high heat conductivity, for example, Al or Cu (Al is most preferable as a material of constituting the support arm since Al is provided with high heat conductivity and is light-weighted).

Further, there may be constituted a suspension having a two-piece structure of a base plate and a flexure load beam without separately providing the flexure 103 and the load beam 104.

As described above, at a front end section of the suspension 100, the slider 101 having a magnetic head element is mounted on the tongue section of the flexure 103. As shown in FIG. 10, traces 106 constituting a necessary number of the input and output signal lines, pass on both sides of the slider 101 and are extended to the front end of the flexure 103, folded back from the front end and connected to input and output electrodes provided at the slider 101.

At a middle section in a length direction of the suspension 100, there is mounted the IC chip 102 on a face the same as a face thereof attached with the slider 101 (on a face of a side opposed to the magnetic disk).

As shown in FIG. 12, the IC chip 102 is a bare chip and is mounted by flip chip bonding to bonding pads 110 provided at a conductor pattern formed on the flexure 103 on the load beam 104 via an insulating material layer 109 of polyimide or the like with, for example, gold balls 111. At a clearance between a bottom face of the IC chip 102 and the thin film pattern, there is filled an underfill 112 for promoting heat radiation characteristic, promoting the mechanical strength and covering the IC chip 102.

According to the embodiment, the flexure 103, the load beam 104 and the base plate 105 of the suspension 100 are constituted by stainless steel including a material having high heat conductivity of, for example, Al or Cu or the like. The base plate 105 is fixedly attached to the support arm and therefore, thereby, the IC chip 102 and the support arm are thermally coupled via the suspension 100 having high heat conductivity. That is, there is constructed a constitution in which heat of the IC chip 102 is conducted to the suspension 100 and conducted further to the support arm and heat is effectively radiated by utilizing the support arm as a heat sink.

As described above, although the IC chip 102 is constituted to be very small-sized and thin, since write current of several tens milliamperes is made to flow, enormous heat is generated. There poses a problem in which the heat not only effects influence on the IC chip 102 per se but also effects influence on the MR type head element and locally heats stainless steel constituting the flexure 103 and the load beam 104 constituting the spring members of the suspension 100. Although the IC chip 102 can be cooled more or less by an air cooling effect by rotating the magnetic disk, since the clearance between the IC chip 102 and the surface of the magnetic disk is very small, it is difficult to provide a measure of promoting the air cooling effect to the side of the IC chip of the suspension also in view of completely preventing the IC chip 102 from being brought into contact with the surface of the magnetic disk.

Hence, according to the embodiment, by constituting the suspension 100 per se with stainless steel having high heat conductivity, heat is radiated by efficiently conducting heat generated by the IC chip 102 to the support arm via the suspension 100.

Therefore, according to the embodiment, the heat of the IC chip can be diverged without hampering a space between the IC chip and the magnetic disk and temperature of the IC chip can be lowered. In this way, the cooling effect of the IC chip can sufficiently be achieved and therefore, the influence by the heat on the MR type head element can be prevented. Further, the IC chip can be prevented from locally heating the suspension and protection of the suspension can be achieved.

Further, according to the embodiment, there is constructed a constitution in which the IC chip 102 is previously mounted on the suspension 100 to thereby integrate HGA and the HGA is attached to the support arm and therefore, integration of a head stack assembly (HSA) constituted by mounting a plurality of HGAs to support arms, becomes very simple, a reduction in a number of integrating steps and shortening of integration time period are achieved and heat can be radiated effectively via the support arms as mentioned above.

Embodiment 5

Figure 13:
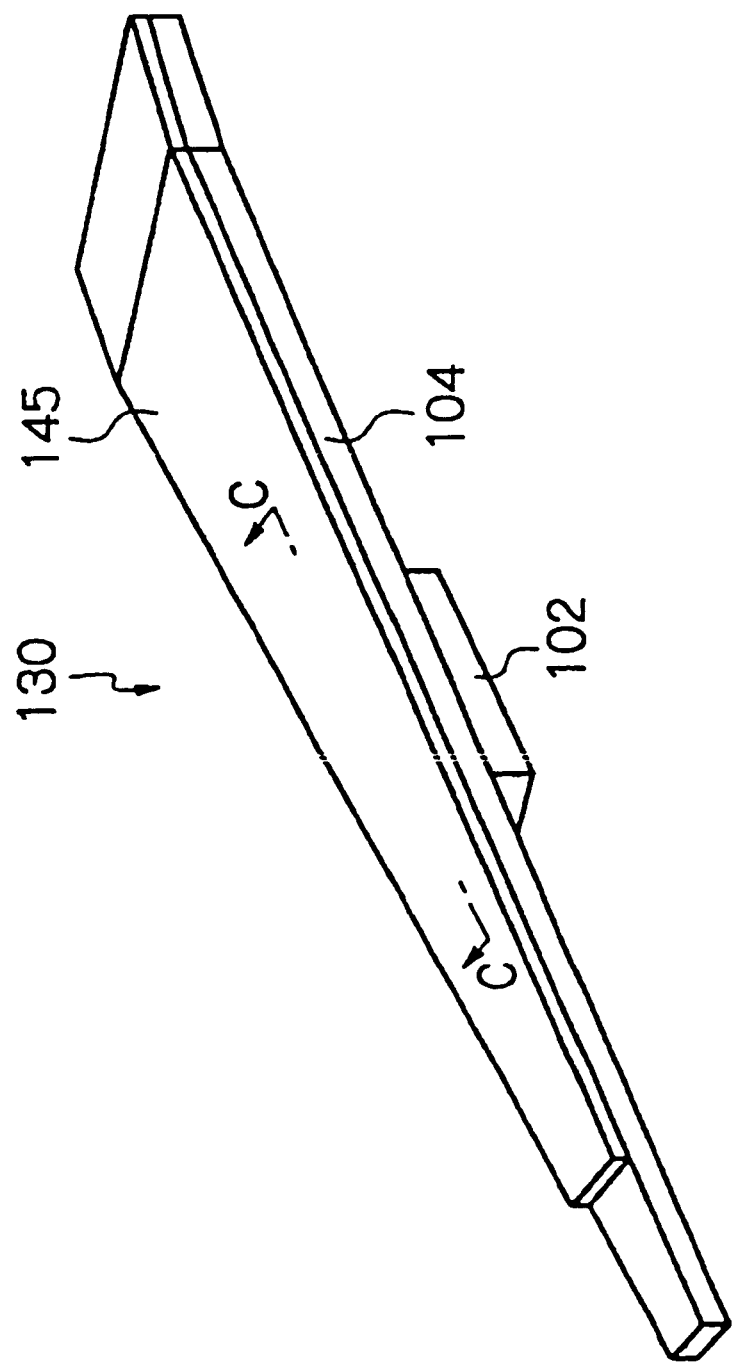
FIG. 13 is a perspective view showing a section of HGA according to a fifth embodiment of the invention.
Figure 14:
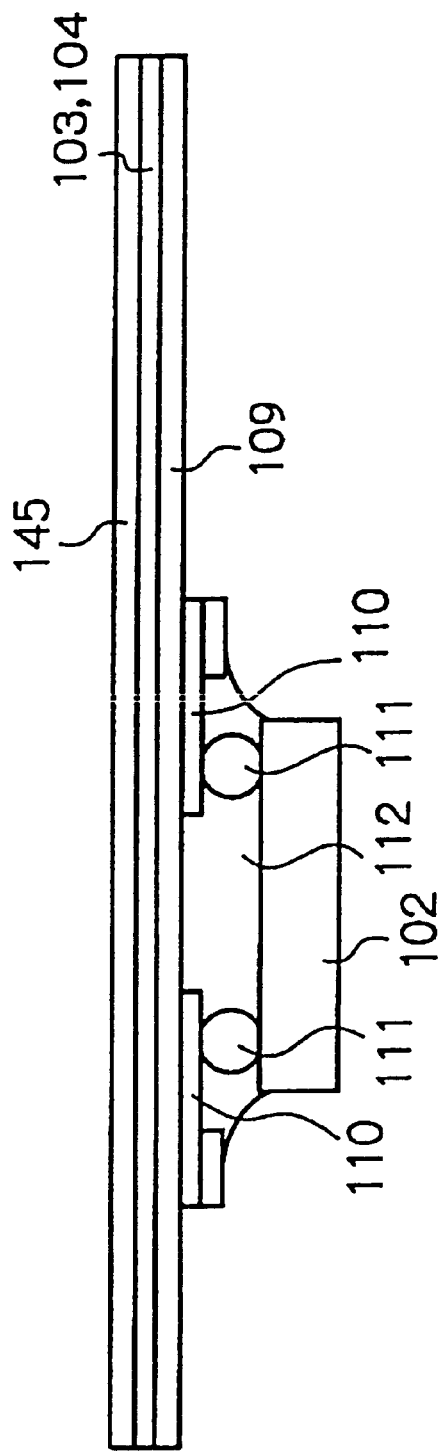
FIG. 14 is a sectional view taken along a line C—C of FIG. 13.

FIG. 13 is a perspective view showing a section of HGA according to a fifth embodiment of a magnetic head apparatus of the invention and FIG. 14 is a sectional view taken along a line C—C of FIG. 13.

As is apparent from the drawings, according to the embodiment, there is constituted a structure in which a plate member 145 having high heat conductivity of, for example, Al or Cu or the like on stainless steel sheets constituting the load beam 104 and the base plate 105 of a suspension 130. The plate member 145 is pasted on the stainless steel sheet by an adhering member or a very thin adhering layer having high heat conductivity. The base plate 105 is fixedly attached to the support arm and accordingly, thereby, the IC chip 102 and the support arm are thermally coupled via the plate member 145 having high heat conductivity. That is, there is constructed a constitution in which heat of the IC chip 102 is conducted to the plate member 145 of the suspension 130 and conducted further to the support arm and heat is effectively radiated by utilizing the support arm as a heat sink.

As the plate member 145, other than Al or Cu, there may be used a metal material or a resin material having high heat conductivity.

Other constitution, used material and operation and effect according to the fourth embodiment are quite similar to those of the case of the embodiment of FIG. 10 through FIG. 12. Therefore, in FIG. 13 and FIG. 14, the same reference numerals are used for constituent elements the same as those of FIG. 11 and FIG. 12.

Further, it is apparent that in the embodiment of FIG. 1 through FIG. 3, the embodiment of FIG. 6 and FIG. 7 and/or the embodiment of FIG. 8 and FIG. 9, the suspension 10 may be constituted as in the embodiment of FIG. 10 through FIG. 12 or the embodiment in FIG. 13 and FIG. 14.

All of the above-described embodiments show the invention as examples and do not show the invention limitedly but the invention can be carried out in other various modified modes and changed modes.

As has been explained in details, according to the invention, there is constructed a constitution in which the IC chip mounted with the circuit for the thin film magnetic head element is not directly mounted on the support arm but is mounted on the suspension and is thermally coupled with the support arm. By constituting in this way, HGA may be formed by previously mounting the IC chip on the suspension, that is, by previously integrating the magnetic head slider and the IC chip on the suspension having the lead conductors and the HGA may be attached to the support arm and accordingly, the integration becomes very simple, a reduction in a number of integrating steps and shortening of integration time period are achieved, further, heat radiation is significantly expedited by conducting heat to the support arm and utilizing the support arm as a heat sink.

As a result, the heat of the IC chip can be diverged without hampering the space between the IC chip and the magnetic disk and temperature of the IC chip can be lowered. In this way, the cooling effect of the IC chip is sufficiently achieved and therefore, the influence on the MR type head element by the heat can be prevented. Further, the IC chip can be prevented from locally heating the suspension and protection of the suspension can be achieved.

What is claimed is:

1. A magnetic head apparatus comprising:
   a magnetic head slider having at least one thin film magnetic head element;
   a suspension mounting the magnetic head slider on one face of the suspension;
   an IC chip mounted with a circuit to drive the thin film magnetic head element; and
   a support arm configured to rigidly support a first section of the suspension such that a second section of the suspension extends beyond the support arm,
   wherein the IC chip is mounted on the one face of the suspension in a substantially co-planar orientation with the support arm and is thermally coupled to the support arm.

2. The magnetic head apparatus according to claim 1,
   wherein the IC chip is mounted to the first section of the suspension supported by the support arm,
   wherein the support arm is brought into contact with another face of the suspension at a section of the suspension mounted with the IC chip.

3. The magnetic head apparatus according to claim 1, wherein the IC chip is mounted to the first section of the suspension supported by the support arm, wherein the support arm and the IC chip are thermally coupled directly via a member having a high heat conductivity.

4. The magnetic head apparatus according to claim 3, wherein the member having the high heat conductivity is brought into contact with a face of the suspension on a side opposed to another face of the suspension for mounting the IC chip.

5. The magnetic head apparatus according to claim 1 wherein the suspension comprises a metal material including a material having a high heat conductivity.

6. The magnetic head apparatus according to claim 1, wherein the suspension includes a laminated material layer having a high heat conductivity on a metal member.

7. The magnetic head apparatus according to claim 1, wherein the IC chip is mounted to the first section of the suspension supported by the support arms, wherein the support arm and the IC chip are thermally coupled via a through port included at a spring member of the suspension.

8. The magnetic head apparatus according to claim 7, wherein the support arm and the IC chip are thermally coupled via only an insulation layer of the suspension.

9. A magnetic disk apparatus comprising a magnetic head apparatus, the magnetic head apparatus including:

a magnetic head slider having at least one thin film magnetic head element;

a suspension mounting the magnetic head slider on one face of the suspension;

an IC chip mounted with a circuit to drive the thin film magnetic head element; and a support arm configured to rigidly support a first section of the suspension such that a second section of the suspension extends beyond the support arm, wherein the IC chip is mounted on the one face of the suspension in a substantially co-planar orientation with the support arm and is thermally coupled to the support arm.

* * * * *